United States Patent
Yoshida et al.

(10) Patent No.: US 9,721,915 B2
(45) Date of Patent: Aug. 1, 2017

(54) SEMICONDUCTOR DEVICE

(71) Applicant: MITSUBISHI ELECTRIC CORPORATION, Chiyoda-ku (JP)

(72) Inventors: Motoru Yoshida, Tokyo (JP); Kazuyo Endo, Tokyo (JP); Jun Fujita, Tokyo (JP); Hiroaki Okabe, Tokyo (JP); Kazuyuki Sugahara, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/119,051

(22) PCT Filed: Feb. 16, 2015

(86) PCT No.: PCT/JP2015/054123
§ 371 (c)(1),
(2) Date: Aug. 15, 2016

(87) PCT Pub. No.: WO2015/159579
PCT Pub. Date: Oct. 22, 2015

(65) Prior Publication Data
US 2016/0358874 A1 Dec. 8, 2016

(30) Foreign Application Priority Data

Apr. 16, 2014 (JP) .................................. 2014-084736

(51) Int. Cl.
*H01L 23/00* (2006.01)
*H01L 29/872* (2006.01)
(Continued)

(52) U.S. Cl.
CPC .......... *H01L 24/13* (2013.01); *H01L 23/3135* (2013.01); *H01L 23/3192* (2013.01);
(Continued)

(58) Field of Classification Search
None
See application file for complete search history.

(56) References Cited

U.S. PATENT DOCUMENTS 8,093,598 B2  1/2012  Ohtsuka et al.
8,154,129 B2  4/2012  Okada et al.
(Continued)

FOREIGN PATENT DOCUMENTS

JP  2000-156407 A  6/2000
JP  2001-110812 A  4/2001
(Continued)

OTHER PUBLICATIONS

International Search Report Issued Apr. 7, 2015 in PCT/JP2015/054123 Filed Feb. 16, 2015.
(Continued)

*Primary Examiner* — Lex Malsawma
(74) *Attorney, Agent, or Firm* — Oblon, McClelland, Maier & Neustadt, L.L.P.

(57) ABSTRACT

A semiconductor device capable of inhibiting oxidation of a Cu wiring even in a high temperature operation. The semiconductor device includes a semiconductor substrate having a main surface, a Cu electrode which is selectively formed on a side of the main surface of the semiconductor substrate, an antioxidant film formed on an upper surface of the Cu electrode except an end portion thereof, an organic resin film which is formed on the main surface of the semiconductor substrate and covers a side surface of the Cu electrode and the end portion of the upper surface thereof, and a diffusion prevention film formed between the organic resin film and the main surface of the semiconductor substrate and between the organic resin film and the side surface and the end portion of the upper surface of the Cu electrode, being in contact therewith.

14 Claims, 7 Drawing Sheets

(51) Int. Cl.
  *H01L 29/40*   (2006.01)
  *H01L 29/66*   (2006.01)
  *H01L 29/16*   (2006.01)
  *H01L 23/36*   (2006.01)
  *H01L 23/373*  (2006.01)
  *H01L 23/31*   (2006.01)
  *H01L 29/47*   (2006.01)

(52) U.S. Cl.
  CPC .......... *H01L 23/36* (2013.01); *H01L 23/3735* (2013.01); *H01L 24/03* (2013.01); *H01L 24/05* (2013.01); *H01L 29/1608* (2013.01); *H01L 29/401* (2013.01); *H01L 29/6606* (2013.01); *H01L 29/872* (2013.01); *H01L 23/564* (2013.01); *H01L 24/06* (2013.01); *H01L 24/33* (2013.01); *H01L 29/47* (2013.01); *H01L 2224/02166* (2013.01); *H01L 2224/0345* (2013.01); *H01L 2224/0346* (2013.01); *H01L 2224/0347* (2013.01); *H01L 2224/03452* (2013.01); *H01L 2224/03614* (2013.01); *H01L 2224/03914* (2013.01); *H01L 2224/04026* (2013.01); *H01L 2224/05084* (2013.01); *H01L 2224/05085* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05166* (2013.01); *H01L 2224/05187* (2013.01); *H01L 2224/05556* (2013.01); *H01L 2224/05562* (2013.01); *H01L 2224/05611* (2013.01); *H01L 2224/05624* (2013.01); *H01L 2224/05639* (2013.01); *H01L 2224/05644* (2013.01); *H01L 2224/05655* (2013.01); *H01L 2224/06181* (2013.01); *H01L 2224/10126* (2013.01); *H01L 2224/13082* (2013.01); *H01L 2224/13147* (2013.01); *H01L 2224/13582* (2013.01); *H01L 2224/13611* (2013.01); *H01L 2224/13624* (2013.01); *H01L 2224/13639* (2013.01); *H01L 2224/13644* (2013.01); *H01L 2224/13655* (2013.01); *H01L 2224/33181* (2013.01); *H01L 2924/00014* (2013.01); *H01L 2924/05042* (2013.01); *H01L 2924/10272* (2013.01); *H01L 2924/12032* (2013.01); *H01L 2924/13055* (2013.01); *H01L 2924/13091* (2013.01); *H01L 2924/181* (2013.01)

(56) References Cited

U.S. PATENT DOCUMENTS

| 2001/0008311 | A1* | 7/2001 | Harada | H01L 24/03 257/758 |
| 2008/0150623 | A1* | 6/2008 | Lin | H01L 23/49555 327/541 |
| 2012/0074508 | A1 | 3/2012 | Ohtsuka et al. | |
| 2014/0327018 | A1* | 11/2014 | Tatsumi | H01L 24/45 257/77 |

FOREIGN PATENT DOCUMENTS

| JP | 2005-79116 A | 3/2005 |
| JP | 2005-243845 A | 9/2005 |
| JP | 2006-108233 A | 4/2006 |
| JP | 2008-159796 A | 7/2008 |
| JP | 2008-258499 A | 10/2008 |
| JP | 2010-92895 A | 4/2010 |
| JP | 2012-186366 A | 9/2012 |
| WO | 2007/108439 A1 | 9/2007 |

OTHER PUBLICATIONS

International Preliminary Report on Patentability and Written Opinion issued Oct. 27, 2016 in PCT/JP2015/054123 (with English language translation).

* cited by examiner

F I G. 1 1
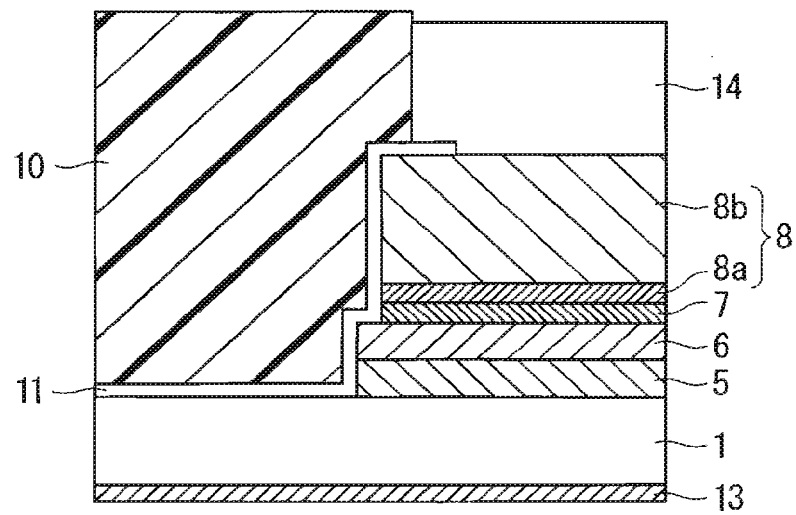
F I G. 1 2
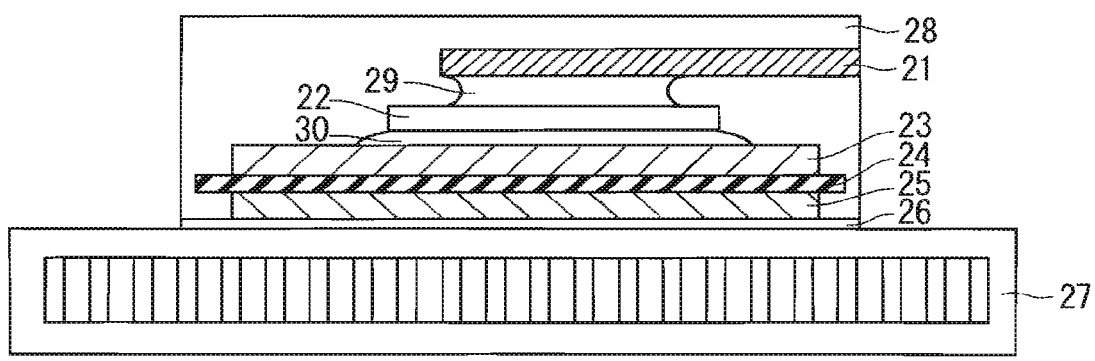

F I G. 1 3

| FILM THICKNESS OF SiN (nm) | 10 | 30 | 50 | 100 | 300 | 500 |
|---|---|---|---|---|---|---|
| FORMATION OF OXIDE FILM | × | ○ | ○ | ○ | ○ | ○ |

SEMICONDUCTOR DEVICE

TECHNICAL FIELD

The present invention relates to a semiconductor device, and more particularly to a technique for preventing oxidation of a Cu wiring electrode.

BACKGROUND ART

Conventionally, as a wiring material of a semiconductor device which is used for power applications or the like, an Al (aluminum)-based material has been used. Though the semiconductor device has been conventionally operated below 200° C., as an operation at high temperature over 200° C. is required, attention is paid to a semiconductor device using a wide gap semiconductor. As an example, there is a semiconductor device using a silicon carbide semiconductor element. In the operation at high temperature over 200° C., however, there arises a problem that the reliability of a silicon carbide semiconductor device is reduced due to mutual reaction between the Al-based wiring material and an electrode of the semiconductor element, a change of form of the Al-based wiring material, or the like. Then, as a wiring material replacing Al, attention is paid to Cu (copper) which can be used at high temperature of 200° C. or higher.

PRIOR-ART DOCUMENTS

Patent Documents

[Patent Document 1] WO 2007/108439

SUMMARY OF INVENTION

Problems to be Solved by the Invention

When a semiconductor device using Cu as the wiring material is operated at 200° C. or higher, a surface of a Cu wiring electrode is oxidized. A semiconductor device is usually covered with an organic resin film as a countermeasure against static electricity in the atmosphere or the like, and in order to solve the above problem, conventionally, a Ni layer is formed on a Cu wiring from an opening of the organic resin film by electroless plating, to thereby inhibit oxidation of the Cu wiring electrode. In an interface between the organic resin film and the Ni layer, however, a hole is formed due to short of adhesion therebetween, and this causes a problem that oxygen or water enters the Cu wiring electrode from the hole.

The present invention is intended to solve the above problem, and it is an object of the present invention to provide a semiconductor device capable of inhibiting oxidation of a Cu wiring even in a high temperature operation.

Means for Solving the Problems

The present invention is intended for a semiconductor device. According to an aspect of the present invention, the semiconductor device includes a semiconductor substrate having a main surface, a Cu electrode which is selectively formed on a side of the main surface of the semiconductor substrate, an antioxidant film formed on an upper surface of the Cu electrode except an end portion thereof, an organic resin film which is formed on the main surface of the semiconductor substrate and covers a side surface of the Cu electrode and the end portion of the upper surface thereof, and an inorganic film formed between the organic resin film and the main surface of the semiconductor substrate and between the organic resin film and the side surface and the end portion of the upper surface of the Cu electrode, being in contact therewith.

Effects of the Invention

According to the aspect of the present invention, the semiconductor device includes a semiconductor substrate having a main surface, a Cu electrode which is selectively formed on a side of the main surface of the semiconductor substrate, an antioxidant film formed on an upper surface of the Cu electrode except an end portion thereof, an organic resin film which is formed on the main surface of the semiconductor substrate and covers a side surface of the Cu electrode and the end portion of the upper surface thereof, and an inorganic film formed between the organic resin film and the main surface of the semiconductor substrate and between the organic resin film and the side surface and the end portion of the upper surface of the Cu electrode, being in contact therewith. Hence, since the adhesion between the antioxidant film formed on the upper surface of the Cu electrode and the inorganic film is high, it is possible to inhibit water and/or oxygen entering from an interface between the organic resin film and the antioxidant film from reaching the surface of the Cu electrode by the inorganic film and the antioxidant film. Therefore, it is possible to inhibit oxidation of the Cu electrode even when the semiconductor device is operated at high temperature and increase the reliability of the semiconductor device.

BRIEF DESCRIPTION OF DRAWINGS

FIG. 11 is a cross section showing a structure of a semiconductor device in accordance with a third preferred embodiment of the present invention;

FIG. 12 is a cross section showing a structure of a semiconductor module in accordance with the third preferred embodiment of the present invention; and FIG. 13 is a view showing oxidation resistance of a Cu electrode at the time when a film thickness of a diffusion prevention film is changed.

DESCRIPTION OF EMBODIMENT(S)

<A. The First Preferred Embodiment>

<A-1. Structure>

A structure of a semiconductor device in accordance with the first preferred embodiment of the present invention will be described. Hereinafter, in the present description, as an example of the semiconductor device, taken is a silicon carbide semiconductor device which contains an n-type silicon carbide Schottky barrier diode (SBD) as a silicon carbide semiconductor element.

Figure 1:
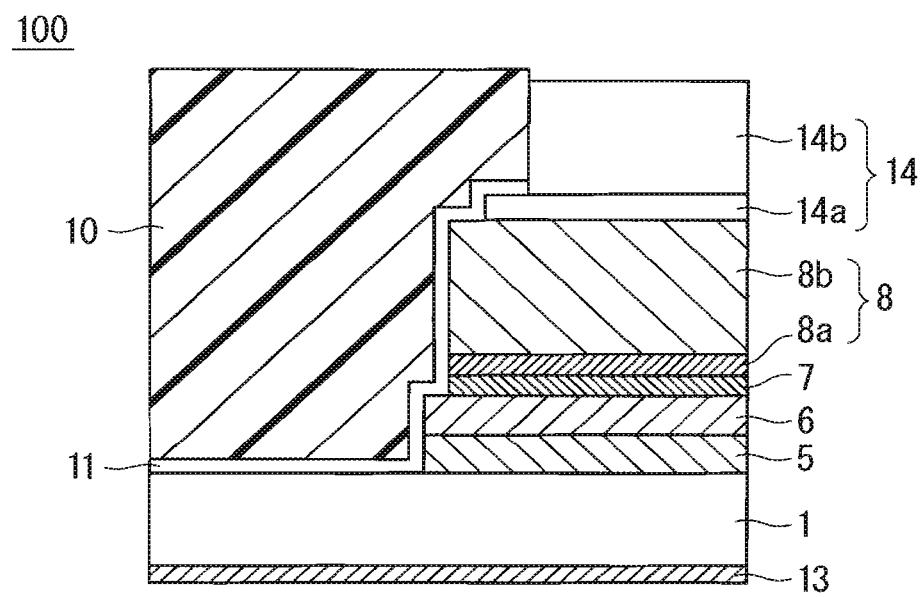
FIG. 1 is a cross section showing a structure of a semiconductor device in accordance with a first preferred embodiment of the present invention.
Figure 2:
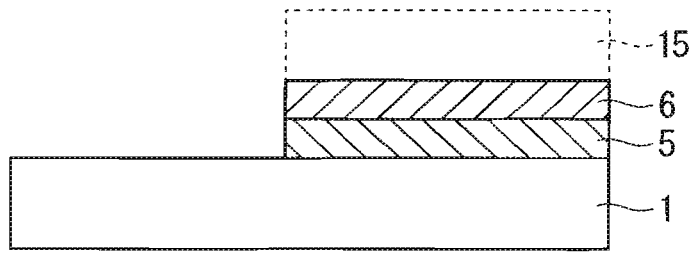
FIG. 2 is a cross section showing a process of manufacturing the semiconductor device in accordance with the first preferred embodiment of the present invention.

FIG. 1 is a cross section showing a structure of a silicon carbide semiconductor device 100, which is taken in a direction perpendicular to a main surface of a substrate. FIG. 1 shows only the left half of the cross section of the silicon carbide semiconductor device 100. In other words, the actual cross section of the silicon carbide semiconductor device 100 is a symmetric one with the right end of the cross section of FIG. 1 as the axis. Further, though a plan view of the silicon carbide semiconductor device 100 is not shown, the same as in FIG. 1 applies to any one of cross sections taken in the direction perpendicular to the main surface of the substrate.

The silicon carbide semiconductor device 100 comprises a substrate 1 which is a semiconductor substrate formed of an n-type silicon carbide (silicon carbide substrate), a Schottky electrode 5, a barrier metal layer 6, a metal layer 7, a Cu electrode 8, an antioxidant film 14, a diffusion prevention film 11, an organic resin film 10, and a back surface external output electrode 13.

Though not shown in FIG. 1, a surface layer on a side of a main surface of the substrate 1 is a drift layer. The Schottky electrode 5 is formed on the main surface of the substrate 1 and has a thickness not smaller than 100 nm and not larger than 500 nm. The barrier metal layer 6 and the metal layer 7 are laminated in sequence on an upper surface of the Schottky electrode 5.

The barrier metal layer 6 has a thickness not smaller than 10 nm and not larger than 200 nm. On an upper surface of the metal layer 7, formed is the Cu electrode 8 which is to serve as a wiring electrode. The Cu electrode 8 consists of a first Cu layer 8a which is a lower layer formed on the upper surface of the metal layer 7 and a second Cu layer 8b which is an upper layer. The first Cu layer 8a is a seed layer used to form the second Cu layer 8b, and the second Cu layer 8b is a front surface external output electrode.

The antioxidant film 14 consists of a first antioxidant film 14a which is a lower layer and a second antioxidant film 14b which is an upper layer. The first antioxidant film 14a is pattern-formed on an upper surface of the second Cu layer 8b of the Cu electrode 8, particularly except an end portion of the upper surface. The first antioxidant film 14a is formed of Ni, Ag, Sn, Al, Au, or an alloy containing these metals, or a multilayer structure consisting of these metals. Then, in terms of preventing oxidation of the Cu electrode 8, the film thickness of the first antioxidant film 14a is not smaller than 10 nm and smaller than 10 μm.

The second antioxidant film 14b is formed in a region on an upper surface of the first antioxidant film 14a except an end portion thereof. In terms of preventing oxidation of the Cu electrode 8, the film thickness of the second antioxidant film 14b is not smaller than 10 nm and smaller than 100 μm. The material of the second antioxidant film 14b may be different from that of the first antioxidant film 14a, but is typically Ni, Ag, Sn, Al, Au, or an alloy containing these metals, or a multilayer structure consisting of these metals.

Respective exposed surfaces of the drift layer of the substrate 1, the Schottky electrode 5, the barrier metal layer 6, the metal layer 7, the Cu electrode 8, and the first antioxidant film 14a are covered with the diffusion prevention film 11. Specifically, the drift layer surface of the substrate 1 and respective side surfaces of the Schottky electrode 5, the barrier metal layer 6, the metal layer 7, the Cu electrode 8, and the first antioxidant film 14a are covered with the diffusion prevention film 11. Further, since the metal layer 7 is formed in a region on an upper surface of the barrier metal layer 6 except an end portion thereof (see FIG. 1), the end portion of the upper surface of the barrier metal layer 6 is also covered with the diffusion prevention film 11. Specifically, on the upper surface of the barrier metal layer 6, the metal layer 7 is formed on a center side thereof and the diffusion prevention film 11 is formed in the end region thereof. Furthermore, the end portion of the upper surface of the Cu electrode 8, on which the first antioxidant film 14a is not formed, is also covered with the diffusion prevention film 11. Specifically, on the upper surface of the Cu electrode 8, the first antioxidant film 14a is formed on a center side thereof and the diffusion prevention film 11 is formed in the end region thereof. Further, the region of the upper surface of the first antioxidant film 14a, on which the second antioxidant film 14b is not formed, is also covered with the diffusion prevention film 11. Specifically, on the upper surface of the first antioxidant film 14a, the second antioxidant film 14b is formed on a center side thereof and the diffusion prevention film 11 is formed in the end region thereof. The diffusion prevention film 11 is an inorganic film formed of SiN, SiON, $Si_3N_4$, or the like. Then, the film thickness thereof is at least not smaller than 100 nm in order to inhibit oxygen or water from entering the Cu electrode 8.

FIG. 13 shows oxidation resistance of the Cu electrode 8 at the time when the film thickness of the diffusion prevention film 11 is changed. The film thickness of the diffusion prevention film 11 formed of SiN is changed to 10, 30, 50, 100, 300, and 500 nm, and in each case, a high temperature storage test is performed at 200° C. for 1000 hours. Then, the oxide film thickness of the Cu electrode 8 is evaluated at that time, and when no oxide film is formed thereon, this is represented by "○", and when an oxide film is formed thereon, this is represented by "x".

It can be seen from FIG. 13 that the oxidation resistance of the Cu electrode 8 can be ensured only when the film thickness of the diffusion prevention film 11 is not smaller than 30 nm. It can be expected, however, that if high densification in the membranaceous of the diffusion prevention film 11 and in a method of forming the diffusion prevention film 11 is realized in future, it will become possible to extremely reduce the thickness of the diffusion prevention film 11, for example, to about 1 nm. Further, when the thickness of the diffusion prevention film 11 is not larger than 10 μm, it is possible to inhibit crack generation due to a stress generated in the diffusion prevention film 11 itself.

The diffusion prevention film 11 may be a semi-insulating SiN having a refractive index not lower than 2.4 and lower than 2.7.

The diffusion prevention film 11 is covered with the organic resin film 10. The organic resin film 10 is polyimide having a film thickness not smaller than 3 µm and not larger than 100 µm. The diffusion prevention film 11 not only serves to prevent the above-described oxidation of the Cu electrode 8 but also serves to prevent diffusion of Cu from the Cu electrode 8 to the organic resin film 10.

On a back surface of the substrate 1, i.e., a surface opposite to the main surface on which the Schottky electrode 5 is formed, the back surface external output electrode 13 is formed. Thus, the structure of the silicon carbide semiconductor device 100 shown in FIG. 1 has been described. In the silicon carbide semiconductor device 100, the substrate 1, the Schottky electrode 5, and the barrier metal layer 6 constitute a silicon carbide Schottky barrier diode.

In the above-described structure of the silicon carbide semiconductor device 100, a hole is formed at an interface between the organic resin film 10 and the antioxidant film 14 due to short of adhesion therebetween. Through the hole, water or oxygen enters the interface. Since the adhesion of the diffusion prevention film 11 which is an inorganic film, to the antioxidant film 14, is higher than that of the organic resin film 10 and a hole is less apt to be formed at an interface between the diffusion prevention film 11 and the antioxidant film 14, it is possible to inhibit the water or the oxygen from reaching the Cu electrode 8 by the diffusion prevention film 11. Therefore, the oxidation of the Cu electrode 8 is inhibited in the high temperature operation and the reliability of the silicon carbide semiconductor device 100 is increased.

<A-2. Manufacturing Method>

Next, a method of manufacturing the silicon carbide semiconductor device 100 shown in FIG. 1 will be described, with reference to FIGS. 2 to 9. FIGS. 2 to 9 are cross sections each showing a process of manufacturing the silicon carbide semiconductor device 100. Further, FIGS. 2 to 9 show only the left half of the cross section of the silicon carbide semiconductor device 100, like FIG. 1.

First, prepared is the substrate 1 formed of an n-type (n$^+$-type) silicon carbide having a high impurity concentration. Then, on the main surface of the substrate 1, by using a target such as Ti, Mo, Ni, or the like, the Schottky electrode 5 having a film thickness not smaller than 100 nm and not larger than 500 nm is formed by, e.g., sputtering. The Schottky electrode 5 is formed entirely on the drift layer surface of the substrate 1. Further, entirely on the surface of the Schottky electrode 5, TiN is formed by, e.g., sputtering, to thereby form the barrier metal layer 6. If Cu is diffused from the Cu electrode 8 to the Schottky electrode 5, this leads to degradation of the electrical characteristics of the silicon carbide semiconductor device, such as an increase of a leakage current or the like, and for this reason, the barrier metal layer 6 is provided in order to prevent this diffusion. In terms of that, it is desirable that the film thickness of the barrier metal layer 6 should be not smaller than 10 nm and not larger than 200 nm.

Next, in order to remove the barrier metal layer 6 from a peripheral portion (the left side of FIG. 2) of the substrate 1, an etching mask 15 formed of a resist pattern made by photolithography is formed only on a center portion (the right side of FIG. 2) of the substrate 1. Then, by using the etching mask 15, the barrier metal layer 6 is etched. When the barrier metal layer 6 is formed of, e.g., TiN, the barrier metal layer 6 is wet-etched.

Subsequently, by using the etching mask 15, the Schottky electrode 5 is etched. When the Schottky electrode 5 is formed of, e.g., Ti, the Schottky electrode 5 is wet-etched with a dilute solution of hydrofluoric acid (see FIG. 2). After that, the etching mask 15 is removed by wet etching using an organic solvent or by ashing using an oxygen plasma. Thus, the silicon carbide Schottky barrier diode which is the silicon carbide semiconductor element of the first preferred embodiment is completed.

Next, on an entire surface, i.e., the barrier metal layer 6 and the drift layer surface of the substrate 1, for example, Ti is formed, to thereby form the metal layer 7. By forming the metal layer 7 on the barrier metal layer 6, the adhesion between the Cu electrode 8 which is formed in the later process step and the barrier metal layer 6 is improved. Further, when the metal layer 7 is formed on the drift layer surface of the substrate 1, since the first Cu layer 8a of the Cu electrode 8 is not formed directly on the drift layer in the later process step, the metal layer 7 serves as a barrier metal against Cu diffusion, and it is thereby possible to inhibit diffusion of Cu from the first Cu layer 8a to the drift layer.

Next, on the upper surface of the metal layer 7, formed is the first Cu layer 8a which is an underlying layer of the second Cu layer 8b. The first Cu layer 8a is a Cu film or a Cu alloy film and is formed by, for example, the PVD (Physical Vapor Deposition) method, thermal evaporation, electron beam evaporation, sputtering, the metal CVD (Chemical Vapor Deposition) method using gas of organic metal or the like, or the like. The first Cu layer 8a is so formed as to have a thickness not smaller than 100 nm and not larger than 1000 nm. Herein, since the first Cu layer 8a is formed on the upper surface of the barrier metal layer 6 with the metal layer 7 interposed therebetween, it is possible to achieve the Cu electrode 8 with high adhesion as mentioned above.

Figure 3:
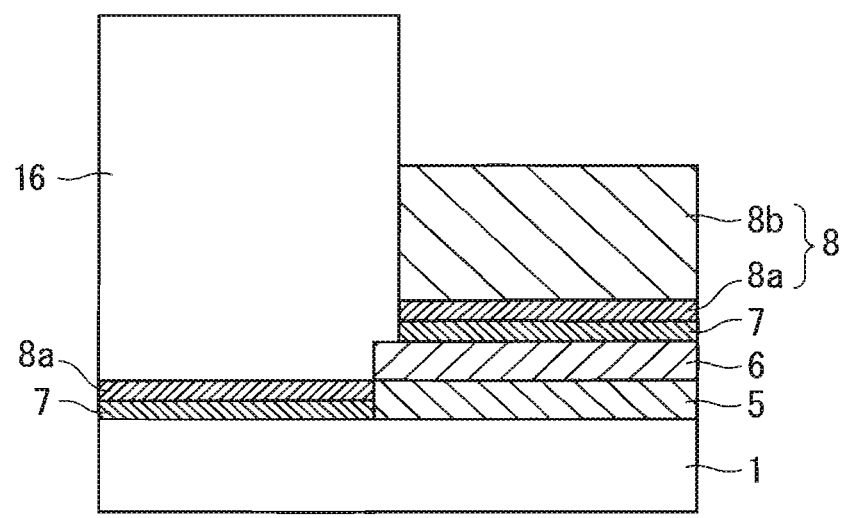
FIG. 3 is a cross section showing a process of manufacturing the semiconductor device in accordance with the first preferred embodiment of the present invention.

Next, a resist is coated, exposed, and developed, to thereby form a resist mask 16 in a region on an upper surface of the first Cu layer 8a in which it is not intended to form the second Cu layer 8b (see FIG. 3). Specifically, the resist mask 16 is patterned so that the upper surface of the first Cu layer 8a which is formed on the barrier metal layer 6 with the metal layer 7 interposed therebetween should be so opened as to form the second Cu layer 8b on the center side (the right side of FIG. 3) of the substrate 1 and not to form the second Cu layer 8b on the peripheral side (the left side of FIG. 3) thereof.

Subsequently, by using the resist mask 16, the second Cu layer 8b is formed by plating. The second Cu layer 8b is formed in a region on the upper surface of the first Cu layer 8a in which the resist mask 16 is not formed, along a sidewall of the resist mask 16. The thickness of the second Cu layer 8b may be, for example, not smaller than 6 µm and smaller than 100 µm, and the thickness of the entire Cu electrode 8 may be not smaller than 7 µm and smaller than 100 µm. Thus, the structure shown in FIG. 3 is formed.

Figure 4:
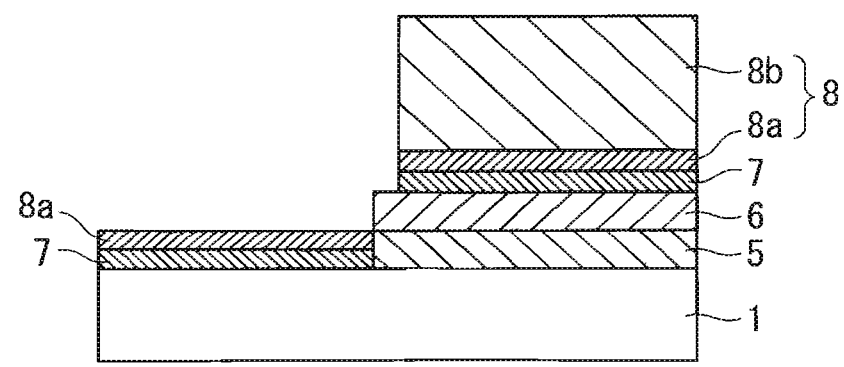
FIG. 4 is a cross section showing a process of manufacturing the semiconductor device in accordance with the first preferred embodiment of the present invention.

Next, the resist mask 16 is removed by wet etching using an organic solvent or by ashing using an oxygen plasma (FIG. 4).

Further, the first Cu layer 8a formed on the surface of the drift layer with the metal layer 7 interposed therebetween is entirely wet-etched. In the wet etching of the first Cu layer 8a, an exposed region of the Cu electrode 8 (the first Cu layer 8a and the second Cu layer 8b) on the upper surface of the barrier metal layer 6 is also exposed to a wet etching solution. Therefore, the Cu electrode 8 in the exposed portion is also etched to some degree.

Figure 5:
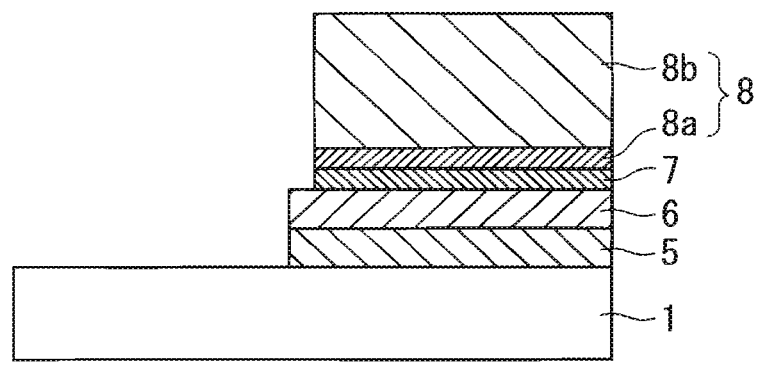
FIG. 5 is a cross section showing a process of manufacturing the semiconductor device in accordance with the first preferred embodiment of the present invention.
Figure 6:
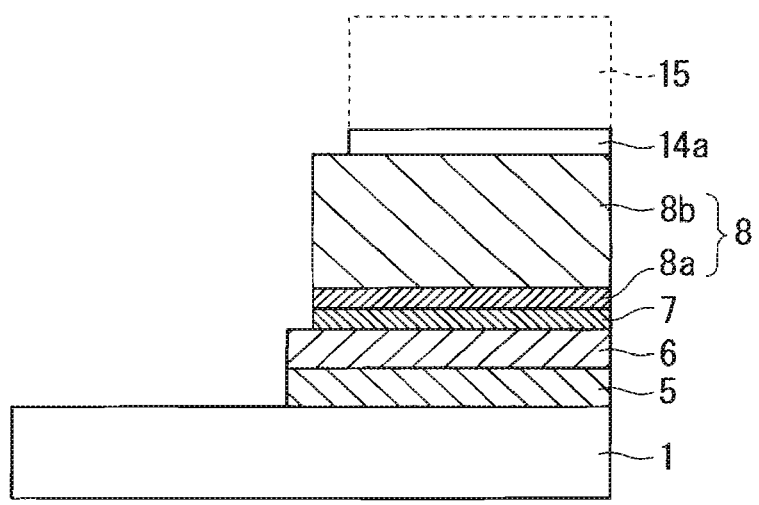
FIG. 6 is a cross section showing a process of manufacturing the semiconductor device in accordance with the first preferred embodiment of the present invention.

Subsequently, by masking the first Cu layer 8a and the second Cu layer 8b, the metal layer 7 formed on the drift layer is removed by using hydrofluoric acid. Through the above process steps, the structure of FIG. 5 is achieved.

Next, the first antioxidant film 14a is entirely formed, and then by using the etching mask 15, the first antioxidant film 14a is removed so that the first antioxidant film 14a should remain in a region on the upper surface of the second Cu layer 8b except the end portion thereof.

After that, the respective exposed surfaces of the Schottky electrode 5, the barrier metal layer 6, the metal layer 7, the Cu electrode 8, the first antioxidant film 14a, and the drift layer are covered with the diffusion prevention film 11. The diffusion prevention film 11 is an inorganic film formed of SiN, SiON, $Si_3N_4$, or the like, and is formed by, for example, the CVD method. The diffusion prevention film 11 is so formed as to have a film thickness of at least 30 nm. Since the film thickness of the diffusion prevention film 11 becomes thinner on the sidewall portion, particularly in a bottom portion thereof, the film thickness of this portion should be not smaller than 30 nm. Further, it is more desirable that the film thickness should be not smaller than 100 nm.

The reason why the film thickness of the diffusion prevention film 11 should be not smaller than 30 nm comes from the result of the high temperature storage test shown in FIG. 13 as described above. Further, the reason also comes from the following. It is generally assumed that the silicon carbide semiconductor device is operated under the condition of high temperature not lower than 200° C. For this reason, a stress generated by heat becomes higher, as compared with in a Si semiconductor device which is not assumed to be operated under the condition of high temperature. Further, the rate of diffusion of Cu due to heat becomes higher. When the film thickness of the organic resin film 10 covering the diffusion prevention film 11 is not smaller than 3 μm and not larger than 100 μm, if the film thickness of the diffusion prevention film 11 is smaller than 30 nm, there arises a problem that a crack is generated in the diffusion prevention film 11 due to the stress of the organic resin film 10 and Cu atoms are diffused in the crack. Therefore, the film thickness of the diffusion prevention film 11 should be not smaller than 30 nm.

Figure 7:
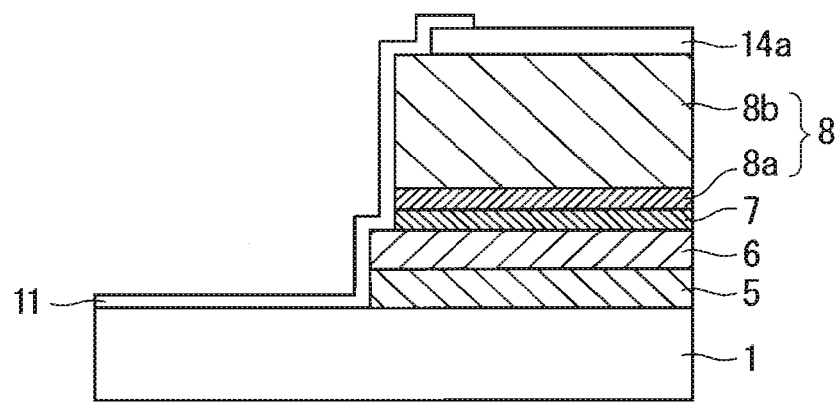
FIG. 7 is a cross section showing a process of manufacturing the semiconductor device in accordance with the first preferred embodiment of the present invention.

Next, the diffusion prevention film 11 is etched by RIE (Reactive Ion Etching) or the like by using the resist pattern made by photolithography as a mask, to thereby expose a region on the upper surface of the first antioxidant film 14a except the end portion thereof (FIG. 7).

Next, the organic resin film 10 is so formed by spin coating or the like as to cover the diffusion prevention film 11 and the exposed upper surface of the first antioxidant film 14a. The organic resin film 10 is so formed as to have a film thickness not smaller than 3 μm and not larger than 100 μm.

Figure 8:
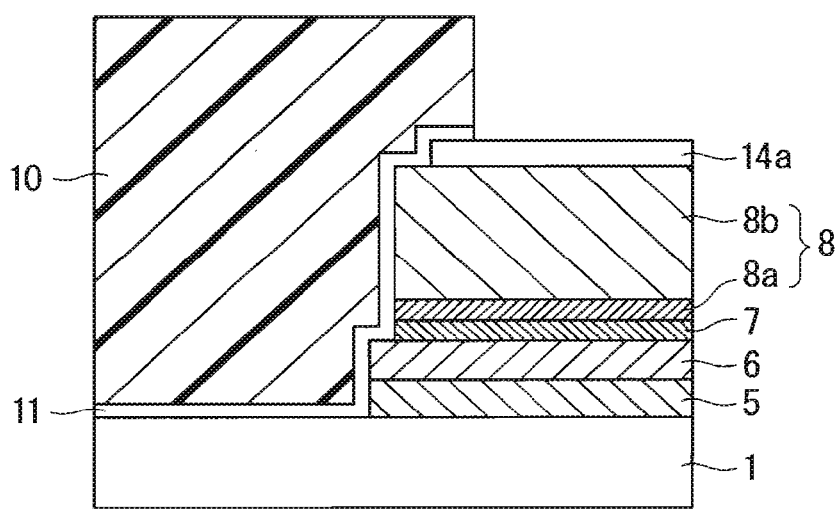
FIG. 8 is a cross section showing a process of manufacturing the semiconductor device in accordance with the first preferred embodiment of the present invention.

Subsequently, the organic resin film 10 is etched by using the resist pattern made by photolithography as a mask, to thereby expose the region on the upper surface of the first antioxidant film 14a except the end portion thereof (FIG. 8).

Figure 9:
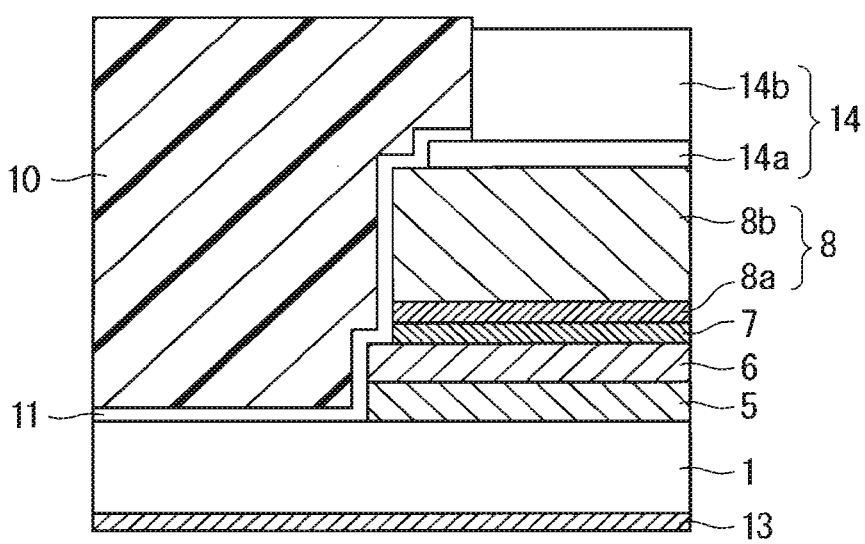
FIG. 9 is a cross section showing a process of manufacturing the semiconductor device in accordance with the first preferred embodiment of the present invention.

Next, the second antioxidant film 14b is formed in an opening of the organic resin film 10 by, for example, electroless plating. The second antioxidant film 14b is formed by, for example, electroless plating. Further, the back surface external output electrode 13 is formed on the back surface of the substrate 1, i.e., the surface opposite to the main surface on which the Schottky electrode 5 is formed. Through the above process steps, the semiconductor device of the first preferred embodiment is achieved (FIG. 9: the same as FIG. 1).

Further, in the above description, the etching of the diffusion prevention film 11 and that of the organic resin film 10 are performed separately. There may be another case, however, where formation of the organic resin film 10 is performed subsequently to formation of the diffusion prevention film 11 and the diffusion prevention film 11 and the organic resin film 10 are etched at the same time, to thereby expose part of the upper surface of the first antioxidant film 14a. This reduces one etching step.

Furthermore, in the present preferred embodiment, since the diffusion prevention film 11 and the organic resin film 10 are each formed by one formation step and one etching step, it is possible to achieve a semiconductor device with high reliability by a simple manufacturing process and a low-cost method.

<A-3. Variations>

The above-described method of manufacturing the silicon carbide semiconductor device is only one exemplary method, and the method of manufacturing the semiconductor device in accordance with the present preferred embodiment is not limited to the above one. Only if the structure shown in FIG. 1 can be finally achieved, manufacturing methods other than the method described in the present preferred embodiment may be adopted.

Further, though the semiconductor element is an n-type silicon carbide Schottky barrier diode in the present preferred embodiment, it goes without saying that the semiconductor element may be a p-type one. Furthermore, as a semiconductor material, besides a silicon carbide, a wide-band gap semiconductor capable of being operated at high temperature may be used.

Further, since an operation under the condition of high breakdown voltage is required in the silicon carbide semiconductor device, if the surface of the Cu electrode 8 is oxidized, this causes degradation of the adhesion with a module member bonded to the Cu electrode and further contributes to a decrease of the reliability, destabilization, a module breakdown, or an unstable operation. In order to achieve a stable high breakdown voltage operation using the silicon carbide, the silicon carbide semiconductor device of the present preferred embodiment is effective.

Though the Schottky barrier diode is used as the semiconductor element in the present preferred embodiment, other devices such as a JBS (Junction Barrier Schottky), a MOSFET (Metal Oxide Field Effect Transistor), a JFET (Junction Field Effect Transistor), an IGBT (Insulated Gate Bipolar Transistor), a PN diode, and the like may be adopted. Only if the structure where Cu is used as a wiring electrode material and the organic resin film 10 covers the semiconductor element is adopted, the present preferred embodiment can be applied to various semiconductor elements.

<A-4. Effects>

The silicon carbide semiconductor device 100 which is an exemplary semiconductor device in accordance with the first preferred embodiment comprises the Cu electrode 8 which is selectively formed on a side of the main surface of the substrate 1, the antioxidant film 14 formed on the upper surface of the Cu electrode 8 except the end portion thereof, the organic resin film 10 which is formed on the main surface of the substrate 1 and covers the side surface of the Cu electrode 8 and the end portion of the upper surface thereof, and the diffusion prevention film 11 which is an inorganic film formed between the organic resin film 10 and the main surface of the substrate 1 and between the organic resin film 10 and the side surface and the end portion of the upper surface of the Cu electrode 8, being in contact therewith. Specifically, steps are provided on the side surface of the Cu electrode 8 and the side surface of the antioxidant film 14, and the diffusion prevention film 11 is provided between the organic resin film 10 and the side surface and the end portion of the upper surface of the Cu electrode 8 along the step. Since the adhesion between the diffusion prevention film 11 and the antioxidant film 14 is higher than that between the organic resin film 10 and the antioxidant film 14, it is possible to block water or oxygen entering from the interface between the organic resin film 10 and the antioxidant film 14 by the antioxidant film 14 and the diffusion prevention film 11 and thereby inhibit the oxidation of the Cu electrode 8.

Further, the antioxidant film 14 comprises the first antioxidant film 14a formed on the Cu electrode 8 and the second antioxidant film 14b formed on the upper surface of the first antioxidant film 14a except the end portion thereof, and the diffusion prevention film 11 is formed between the organic resin film 10 and the side surface and the end portion of the upper surface of the first antioxidant film 14a, being in contact therewith. Specifically, steps are provided not only on the side surface of the Cu electrode 8 and the side surface of the first antioxidant film 14a but also on the side surface of the first antioxidant film 14a and the side surface of the second antioxidant film 14b, and the diffusion prevention film 11 is provided between the organic resin film 10 and the side surface and the end portion of the upper surface of the first antioxidant film 14a along the step. Since the distance leading to the Cu electrode 8 along an interface between the first antioxidant film 14a and the diffusion prevention film 11 thereby becomes longer, it is possible to block water or oxygen entering from an interface between the organic resin film 10 and the second antioxidant film 14b by the diffusion prevention film 11 and thereby further inhibit the oxidation of the Cu electrode 8.

Furthermore, since the silicon carbide semiconductor device 100 further comprises the barrier metal layer 6 formed between the substrate 1 and the Cu electrode 8 and the diffusion prevention film 11 is also formed between the side surface of the barrier metal layer 6 and the organic resin film 10, being in contact therewith, it is possible to block water or oxygen entering from the interface between the organic resin film 10 and the diffusion prevention film 11 by the diffusion prevention film 11 and thereby inhibit the oxidation of the Cu electrode 8.

The Cu electrode 8 is formed on the upper surface of the barrier metal layer 6 except the end portion thereof, and the diffusion prevention film 11 is formed between the organic resin film 10 and the side surface and the end portion of the upper surface of the barrier metal layer 6, being in contact therewith. Also in such a structure, it is possible to block water or oxygen entering from the interface between the organic resin film 10 and the diffusion prevention film 11 by the diffusion prevention film 11 and thereby inhibit the oxidation of the Cu electrode 8.

In the present preferred embodiment, the diffusion prevention film 11 is provided also on the side surface of the Cu electrode 8. When the diffusion prevention film 11 is provided between the side surface of the Cu electrode 8 and the organic resin film 10, this produces an effect of inhibiting water or/and oxygen in the organic resin film 10 from being diffused into the Cu electrode 8 and reacting to Cu.

Though the diffusion prevention film 11 is formed also on the substrate 1 in the present preferred embodiment, the diffusion prevention film 11 may not be formed on the substrate 1. When the diffusion prevention film 11 is not formed on the main surface of the substrate 1, however, a reactant of the reaction between Cu and water is generated on the main surface of the substrate 1, and this sometimes causes a problem of degrading the insulation properties and the reliability of the semiconductor device. As shown in FIG. 1 of the first preferred embodiment, when the diffusion prevention film 11 is provided from between the substrate 1 and the organic resin film 10 to the side surface and the upper surface of the Cu electrode 8 continuously, even if Cu is diffused from the Cu electrode 8 up to the main surface of the substrate 1 along the diffusion prevention film 11, since the diffusion prevention film 11 is provided between the organic resin film 10 and the substrate 1, it is possible to inhibit water and/or oxygen in the organic resin film 10 from reacting to Cu.

<B. The Second Preferred Embodiment>
<B-1. Structure>

Figure 10:
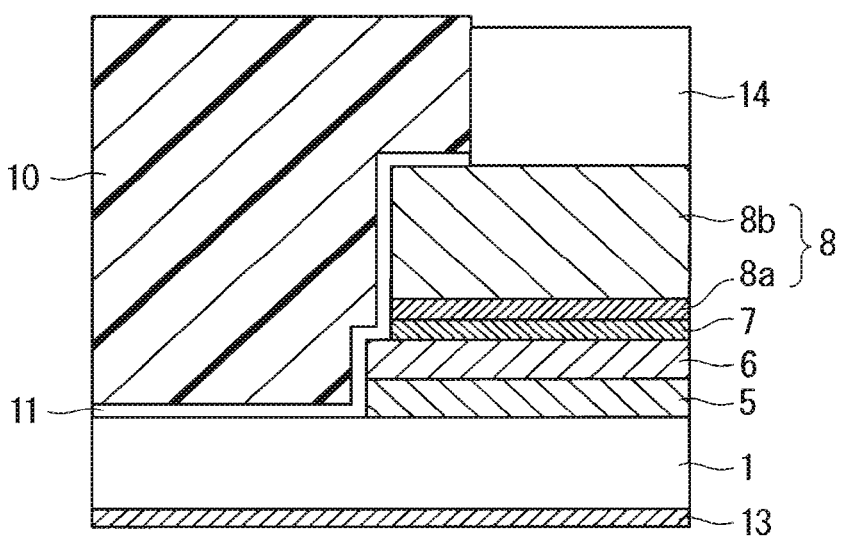
FIG. 10 is a cross section showing a structure of a semiconductor device in accordance with a second preferred embodiment of the present invention.

In the silicon carbide semiconductor device 100 in accordance with the first preferred embodiment, the antioxidant film 14 has a two-layer structure consisting of the first antioxidant film 14a and the second antioxidant film 14b, and oxygen and/or water entering from the hole formed due to short of adhesion between the side surface of the organic resin film 10 and the second antioxidant film 14b is blocked by the first antioxidant film 14a. In a silicon carbide semiconductor device 101 shown in FIG. 10 in accordance with the second preferred embodiment, however, the antioxidant film 14 has a single layer structure and a thickness not smaller than 10 nm and smaller than 100 μm.

The silicon carbide semiconductor device 101 has the same structure as that of the silicon carbide semiconductor device 100 except that the antioxidant film 14 has a single layer structure. Even in such a structure, since the adhesion between the diffusion prevention film 11 and the antioxidant film 14 is ensured, it is possible to inhibit oxygen or water from entering the Cu electrode 8 only if the film thickness of the diffusion prevention film 11 is ensured to be not smaller than 30 nm.

<B-2. Manufacturing Method>

A method of manufacturing the silicon carbide semiconductor device 101 is the same as the method of manufacturing the silicon carbide semiconductor device 100 until the formation of the Cu electrode 8. After the Cu electrode 8 is formed on the metal layer 7, the diffusion prevention film 11 and the organic resin film 10 are sequentially laminated entirely. Then, the diffusion prevention film 11 and the organic resin film 10 are so etched as to expose the region on the upper surface of the Cu electrode 8 except the end portion thereof, to thereby form an opening. After that, the antioxidant film 14 is formed on the Cu electrode 8 from the opening.

<B-3. Effects>

The silicon carbide semiconductor device 101 has a structure in which the antioxidant film 14 has a single layer structure and a thickness not smaller than 10 nm and not larger than 100 μm in the structure of the silicon carbide semiconductor device 100. Even in such a structure, since the adhesion between the diffusion prevention film 11 and the antioxidant film 14 is ensured, it is possible to inhibit oxygen or water from entering the Cu electrode 8 only if the film thickness of the diffusion prevention film 11 is ensured to be not smaller than 30 nm.

Further, the method of manufacturing the silicon carbide semiconductor device 101 comprises (a) a step of forming the Cu electrode 8 on the substrate 1, (b) a step of covering the substrate 1 and the Cu electrode 8 with the diffusion prevention film 11 which is an inorganic film, (c) a step of covering the diffusion prevention film 11 with the organic resin film 10, (d) a step of forming an opening by etching the organic resin film 10 and the diffusion prevention film 11, to thereby expose the Cu electrode 8 from the opening, and (e) a step of forming the antioxidant film 14 on the Cu electrode 8 in the opening. This method produces an effect of reducing the manufacturing process steps, as compared with the method of manufacturing the silicon carbide semiconductor device 100, since the antioxidant film 14 has a single layer structure.

<C. The Third Preferred Embodiment>

FIG. 11 is a cross section showing a structure of a silicon carbide semiconductor device 102 in accordance with the third preferred embodiment. The silicon carbide semiconductor device 102 has a structure in which the antioxidant film 14 is formed on part of the diffusion prevention film 11 in the structure of the silicon carbide semiconductor device 101 in accordance with the second preferred embodiment. Since the structure other than the above is the same as that of the silicon carbide semiconductor device 101 shown in FIG. 10 in accordance with the second preferred embodiment, description thereof will be omitted.

In the silicon carbide semiconductor device 101 of the second preferred embodiment, the antioxidant film 14 has a single layer structure and is adjacent to the diffusion prevention film 11, and it is thereby possible to block oxygen and/or water entering from the hole generated due to short of adhesion between the organic resin film 10 and the antioxidant film 14.

In the third preferred embodiment shown in FIG. 11, however, the antioxidant film 14 is adjacent to the diffusion prevention film 11 and formed also on the diffusion prevention film 11. It is thereby possible to block oxygen and/or water entering from the hole generated due to short of adhesion between the organic resin film 10 and the antioxidant film 14 by the interface between the diffusion prevention film 11 and the antioxidant film 14. Further, since the side surface and the upper surface of the diffusion prevention film 11 is adhered to the antioxidant film 14, an adhesion region of the diffusion prevention film 11 and the antioxidant film 14 is larger than that in the second preferred embodiment. Therefore, the above blocking effect becomes greater than that in the second preferred embodiment and the reliability is thereby increased.

<D. The Fourth Preferred Embodiment>

FIG. 12 is a cross section showing a structure of a silicon carbide semiconductor module in accordance with a fourth preferred embodiment. The silicon carbide semiconductor module comprises a semiconductor chip 22, conductive plates 21, 23, and 25, an insulating ceramics 24, a cooler 27, and a resin 28.

On an upper surface and a lower surface of the insulating ceramics 24, the conductive plates 23 and 25 are bonded, respectively. The conductive plate 25 is bonded to the cooler 27 with a bonding member 26 interposed therebetween. The conductive plate 23 is bonded to a lower surface of the semiconductor chip 22 with a die bonding member 30 interposed therebetween.

As the semiconductor chip 22, adopted is any one of the silicon carbide semiconductor devices 100 to 102 described in the first to third preferred embodiments. An upper surface of the semiconductor chip 22 is bonded to the conductive plate 21 with a bonding member 29 interposed therebetween. The conductive plate 21, the semiconductor chip 22, the conductive plate 23, the insulating ceramics 24, and the conductive plate 25 are sealed by the resin 28.

Thus, the silicon carbide semiconductor module shown in FIG. 12 has a structure in which the semiconductor chip 22 is bonded to the cooler 27 with the insulating ceramics 24 interposed therebetween.

Further, the cooler 27 is not only set below the semiconductor chip 22 as shown in FIG. 12 but may be also set above the semiconductor chip 22 or both above and below the semiconductor chip 22.

The semiconductor chip 22 can be operated at 200° C. or higher. Therefore, by using a structure capable of reducing the thermal resistance between the semiconductor chip 22 and the cooler 27, it is possible to reduce the size of the silicon carbide semiconductor module. By using this, for example, it further becomes possible to reduce the size of an inverter.

In the present invention, the preferred embodiments may be freely combined, or may be changed or omitted as appropriate, without departing from the scope of the invention.

DESCRIPTION OF REFERENCE NUMERALS 1 substrate, 5 Schottky electrode, 6 barrier metal layer, 7 metal layer, 8 Cu electrode, 8a first Cu layer, 8b second Cu layer, 10 organic resin film, 11 diffusion prevention film, 13 back surface external output electrode, 14 antioxidant film, 14a first antioxidant film, 14b second antioxidant film, 15 etching mask, 16 resist mask, 21, 23, 25 conductive plate, 22 semiconductor chip, 24 insulating ceramics, 27 cooler, 28 resin, 100, 101, 102 silicon carbide semiconductor device

The invention claimed is:

1. A semiconductor device comprising:
a semiconductor substrate having a main surface;
a Cu electrode which is selectively formed above said main surface of said semiconductor substrate;
an inorganic film continuously formed from an end portion of an upper surface of said Cu electrode through a lateral side surface of said Cu electrode and through said main surface of said semiconductor substrate, said inorganic film being in contact with said end portion of said upper surface of said Cu electrode, with said lateral side surface of said Cu electrode, and with said main surface of said semiconductor substrate;
an antioxidant film formed in a region of said upper surface of said Cu electrode except said end portion thereof so as to be in close contact with a lateral side surface of said inorganic film, which is formed on said end portion of said upper surface of said Cu electrode, said antioxidant film being formed on part of an upper surface of said inorganic film so as to be in close contact with said part of said upper surface of said inorganic film, which is formed on said end portion of said upper surface of said Cu electrode; and
an organic resin film formed on said inorganic film, in a region without said antioxidant film.

2. The semiconductor device according to claim 1, wherein
said antioxidant film comprises
a first antioxidant film formed on said Cu electrode; and
a second antioxidant film formed on an upper surface of said first antioxidant film except an end portion thereof, and
said inorganic film is formed to be in contact with a side surface of said first antioxidant film.

3. The semiconductor device according to claim 2, wherein said first antioxidant film is formed of Ni, Ag, Sn, Al, Au, or an alloy containing these metals, having a thickness not smaller than 10 nm and smaller than 10 μm.

4. The semiconductor device according to claim 2, wherein
said second antioxidant film is formed of Ni, Ag, Sn, Al, Au, or an alloy containing these metals, having a thickness not smaller than 10 nm and smaller than 100 μm.

5. The semiconductor device according to claim 1, further comprising:
a barrier metal layer formed between said semiconductor substrate and said Cu electrode,
wherein said inorganic film is formed to be in contact with a side surface of said barrier metal layer.

6. The semiconductor device according to claim 5, wherein
said Cu electrode is formed on an upper surface of said barrier metal layer except an end portion thereof, and
said inorganic film is formed to be in contact with said upper surface of said barrier metal layer.

7. The semiconductor device according to claim 1, wherein
said antioxidant film is formed of Ni, Ag, Sn, Al, Au, or an alloy containing these metals, having a thickness not smaller than 10 nm and smaller than 100 μm.

8. The semiconductor device according to claim 1, wherein
said inorganic film is formed of SiN, having a thickness not smaller than 30 nm and smaller than 10 μm.

9. The semiconductor device according to claim 8, wherein
said inorganic film is formed of semi-insulating SiN having a refractive index not lower than 2.4 and lower than 2.7.

10. The semiconductor device according to claim 1, wherein
said inorganic film is formed of SiON, having a thickness not smaller than 30 nm and smaller than 10 μm.

11. The semiconductor device according to claim 1, wherein
a thickness of said organic resin film is not smaller than 3 μm and smaller than 100 μm.

12. The semiconductor device according to claim 1, wherein
a thickness of said Cu electrode is not smaller than 7 μm and smaller than 100 μm.

13. The semiconductor device according to claim 1, wherein
said semiconductor substrate is a silicon carbide substrate.

14. A semiconductor device comprising:
a semiconductor substrate having a main surface;
a Cu electrode which is selectively formed above said main surface of said semiconductor substrate;
an antioxidant film formed on an upper surface of said Cu electrode except an end portion thereof;
an inorganic film continuously formed from an end portion of an upper surface of said antioxidant film through a lateral side surface of said antioxidant film, through said end portion of said upper surface of said Cu electrode, through a lateral side surface of said Cu electrode, and through said main surface of said semiconductor substrate, said inorganic film being in contact with said end portion of said upper surface of said antioxidant film, with said lateral side surface of said antioxidant film, with said end portion of said upper surface of said Cu electrode, with said lateral side surface of said Cu electrode, and with said main surface of said semiconductor substrate, said inorganic film being in close contact with said antioxidant film; and
an organic resin film formed on said inorganic film.

* * * * *